US011688995B2

(12) United States Patent
Spector et al.

(10) Patent No.: US 11,688,995 B2
(45) Date of Patent: Jun. 27, 2023

(54) GRATING EMITTER SYSTEMS WITH CONTROLLED POLARIZATION

(71) Applicant: The Charles Stark Draper Laboratory, Inc., Cambridge, MA (US)

(72) Inventors: Steven J. Spector, Lexington, MA (US); Steven J. Byrnes, Watertown, MA (US); Robert Lutwak, Marblehead, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 184 days.

(21) Appl. No.: 17/076,149

(22) Filed: Oct. 21, 2020

(65) Prior Publication Data

US 2021/0119410 A1 Apr. 22, 2021

Related U.S. Application Data

(60) Provisional application No. 62/923,926, filed on Oct. 21, 2019.

(51) Int. Cl.
*H01S 5/026* (2006.01)
*H01S 5/10* (2021.01)
*H01S 5/062* (2006.01)

(52) U.S. Cl.
CPC ........ *H01S 5/0268* (2013.01); *H01S 5/06236* (2013.01); *H01S 5/1003* (2013.01)

(58) Field of Classification Search
CPC .. H01S 5/0268; H01S 5/06236; H01S 5/1003; G02F 1/0136; G02F 1/011; G04F 5/14; H04B 10/11; H04B 10/50; G02B 6/34
See application file for complete search history.

(56) References Cited

U.S. PATENT DOCUMENTS

| | | | |
|---|---|---|---|
| 10,365,435 B1* | 7/2019 | Karimelahi | G02B 6/124 |
| 2013/0315527 A1* | 11/2013 | Sun | G02F 1/0126 385/14 |
| 2014/0178000 A1* | 6/2014 | Kemp | G02B 6/3592 600/478 |
| 2014/0299743 A1* | 10/2014 | Miller | G02F 1/0136 359/629 |
| 2016/0246009 A1* | 8/2016 | Jiang | G02B 6/124 |
| 2016/0306115 A1* | 10/2016 | Koonen | H04J 14/04 |
| 2016/0313505 A1* | 10/2016 | Ma | G02B 6/2726 |
| 2017/0146958 A1* | 5/2017 | Gallinet | H03L 7/26 |
| 2017/0281102 A1* | 10/2017 | Ken | G04F 5/14 |
| 2019/0265486 A1* | 8/2019 | Hansotte | G02B 26/101 |

OTHER PUBLICATIONS

Jau, Y.-Y., et al. "Push-Pull Optical Pumping of Pure Superposition States," American Physical Society, 93(16): 160802-1-160802-4 (2004).
Taillaert, D., et al., "An Out-of-Plane Grating Coupler for Efficient Butt-Coupling Between Compact Planar Waveguides and Single-Mode Fibers," IEEE Journal of Quantum Electronics, 38(7): 949-955 (2002).
Lutwak, R., "The SA.45s Chip-Scale Atomic Clock—Early Production Statistics," Proceedings of the 43rd Annual Precise Time and Time Interval Systems and Applications Meeting, 1-12 (2011).

\* cited by examiner

*Primary Examiner* — Ellen E Kim
(74) *Attorney, Agent, or Firm* — HoustonHogle LLP (57) ABSTRACT

A grating emitter method and system for modulating the polarization of an optical beam, such as one for transmission through free-space or use in an atomic clock.

20 Claims, 7 Drawing Sheets

GRATING EMITTER SYSTEMS WITH CONTROLLED POLARIZATION

RELATED APPLICATIONS

This application claims the benefit under 35 USC 119(e) of U.S. Provisional Application No. 62/923,926, filed on Oct. 21, 2019, which is incorporated herein by reference in its entirety.

BACKGROUND OF THE INVENTION

A number of techniques exist for controlling the polarization of an optical beam such as a beam transmitted through free-space. For a fixed polarization state, present approaches use free-space optical beams transmitted through polarization rotation optics. If a variable polarization is needed, liquid crystal polarization rotators can be employed. These devices are common in liquid crystal display technology.

A particular application for variable-polarization beams is compact atomic clocks, and in this case, it is also important to create a large, uniform, illuminated area with minimal volume and fabrication complexity.

SUMMARY OF THE INVENTION

These previous approaches for beam polarization control have a number of drawbacks. Free space polarization rotation optics are bulky, mechanically fragile, highly sensitive to thermomechanical misalignment, and expensive. Moreover, adjustment of polarization requires either hand or motorized rotation of the optics. On the other hand, fabrication of liquid crystal optics requires boutique fabrication processes. Moreover, switching of polarization requires dynamic control of molecules in the liquid state and is therefore quite slow, i.e., kilohertz (kHz), thereby prohibiting higher speed modulation such as polarization modulation stretching to megahertz (MHz) and gigahertz (GHz) speeds, whereas GHz speeds are useful for push-pull optical pumping in atomic clocks, for example.

One aspect of the invention relates to a photonic integrated circuit including a waveguide-coupled multilayer grating emitter. According to one configuration, the grating emitter emits a coherent beam of light in which polarization is controlled. For example, the polarization is continuously or discretely varied from right-circular polarization (σ+) to left-circular polarization (σ−), including all intermediate elliptical states, e.g. horizontal (⊥) or vertical (∥) linear polarization.

The approaches can provide a number of advantages. It may be fabricated using wafer-scale batch manufacturing processes, can be readily integrated with future integrated photonic devices for laser beam generation and frequency and amplitude control, and/or can support high-bandwidth polarization modulation, thereby enabling push-pull optical pumping of atoms and high-bandwidth free-space communications.

The grating emitter can be a solid state device, with no moving parts, that provides variable polarization. Unlike conventional free-space phase retarders, this grating emitter can be rugged and does not require mechanical rotation of optical components to vary polarization.

Moreover, the grating emitter can be tuned to operate at any wavelength for which the materials are transparent. Also, unlike liquid-crystal variable retarders or photoelastic modulators, the switching speed of the polarization is determined by the bandwidth of the phase modulator, which can be many gigahertz, compared to kilohertz, which enables applications in high-speed polarization modulation.

Based on the wavelength and the spacing of the grating lines, the present grating emitter can be optimized to emit a beam at directions other than perpendicular to the face of the device. Fine adjustment of the emission angle can be accomplished by adjusting the temperature of the device, for example.

Another possible use of the present grating emitter is in the development of compact atomic sensors and atomic clocks. It is expected that future, rugged, atomic sensors will rely on integrated photonics for generation and frequency control of laser light for atomic state manipulation. The present approach can provide the minimally complex geometry for coupling the light to the atoms with no additional optics for beam collimation or polarization control. In addition, this grating emitter allows for in situ run-time optimization of polarization, e.g. for magneto-optical trapping beams, without mechanical adjustment.

Also of great interest is modulating the polarization at gigahertz frequencies which are sub-harmonic to the atomic ground state hyperfine frequency, thus enabling push-pull optical pumping of hyperfine polarization for atomic clocks and magnetometers. See Jau, et. al., "*Push-Pull Optical Pumping of Pure Superposition States*," PRL, Vol. 93, No. 16, October 2004. This could potentially enable 100× improvement in signal strength, and thereby short-term stability, in chip-scale atomic clocks, with minimal increase in size, power, or complexity.

The grating emitter is also applicable to free-space optical communications, where the data is encoded in the polarization state of the transmitted optical beam, such as in addition to phase, frequency and/or amplitude modulation. The potential high bandwidth of polarization modulation makes this possible where, previously, no such capability existed.

Additional uses include atomic magnetometers, atomic accelerometers and gravimeters, and atomic gyroscopes.

For example, related to the application of compact atomic clocks mentioned above, aspects of this invention also concern methods and systems for sending light from a chip into a large area, with a compact form-factor, and preferably with push-pull optical pumping. The prototypical configuration is represented by the SA.45s chip-scale atomic clock, as described in R. Lutwak, *The SA.45s Chip-Scale Atomic Clock—Early Production Statistics* (Proceedings of the 43rd Annual Precise Time and Time Interval Systems and Applications Meeting, 2011) (hereinafter Lutwak). Here, a vertical cavity surface-emitting laser (VCSEL) sends a beam into an atomic vapor cell, and a spacer between the VCSEL and atoms allows the beam to spread out, to reduce light intensity nonuniformity in the cell, as nonuniform light intensity negatively impacts atomic clock performance. Reducing the size of this spacer, while maintaining or improving light intensity uniformity in the atomic vapor cell, would enable improvements in cost, size, and other aspects of the device.

To this end, an aspect of this invention is a photonic integrated circuit in which numerous beams are emitted, one from each of numerous grating couplers, and with each beam being collimated by its own microlens of a microlens array. As the beams do not substantially overlap at any point, the optical phase relation between beams is irrelevant, and does not need to be well-controlled during fabrication and operation. As each collimated beam is smaller than the full vapor cell—for example, one collimated beam might have 100 micrometer (μm) diameter, whereas the whole vapor cell might be 1 millimeter (mm) across—the spacer separating the grating emitter from the collimating microlens can be proportionally thinner. Moreover, since each beam is approximately collimated, rather than diverging, the uniformity may be improved. Finally, variants of this design can also incorporate push-pull optical pumping, for enhanced signal-to-noise ratio.

In general, according to one aspect, the invention features a system for modulating polarization of an optical beam. The system comprises a light source for generating light into a first waveguide and a second waveguide, a first grating coupler for coupling the light from the first waveguide into an output emission, a second grating coupler for coupling the light from the second waveguide into the output emission, and at least one phase shifter for shifting the phase of the light between the first waveguide and the second waveguide.

In embodiments, at least one variable attenuator is further provided for controlling the relative amplitude of the light in the first waveguide and the second waveguide.

In some examples, the first grating coupler and the second grating coupler are vertically aligned over each other and an axis of first grating coupler and an axis of the second grating coupler could be orthogonal to each other.

Often, a first mode expander is provided for coupling the first waveguide to the first grating coupler; and a second mode expander is provided for coupling the second waveguide to the second grating coupler.

In a current implementation, the first waveguide is fabricated in a first guiding layer and the second waveguide is fabricated in a second guiding layer, and a spacer cladding layer preferably separates the first guiding layer and the second guiding layer.

In general, according to one aspect, the invention features a system for generating an array of beams. This system comprises a substrate, an optical splitter in the substrate for splitting a received optical signal into separate optical signals, and an array of grating emitters, the grating emitters for coupling the separate optical signals out of the substrate into beam array.

In embodiments, a lens array is provided for collimating beams of the beam array.

Also, a quarter wave plate can be added for changing a polarization of beams of the beam array.

In some examples, the grating emitters comprise vertical polarization grating emitters and horizontal polarization grating emitters. And, these emitters might be arranged in pairs or a checkerboard pattern.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
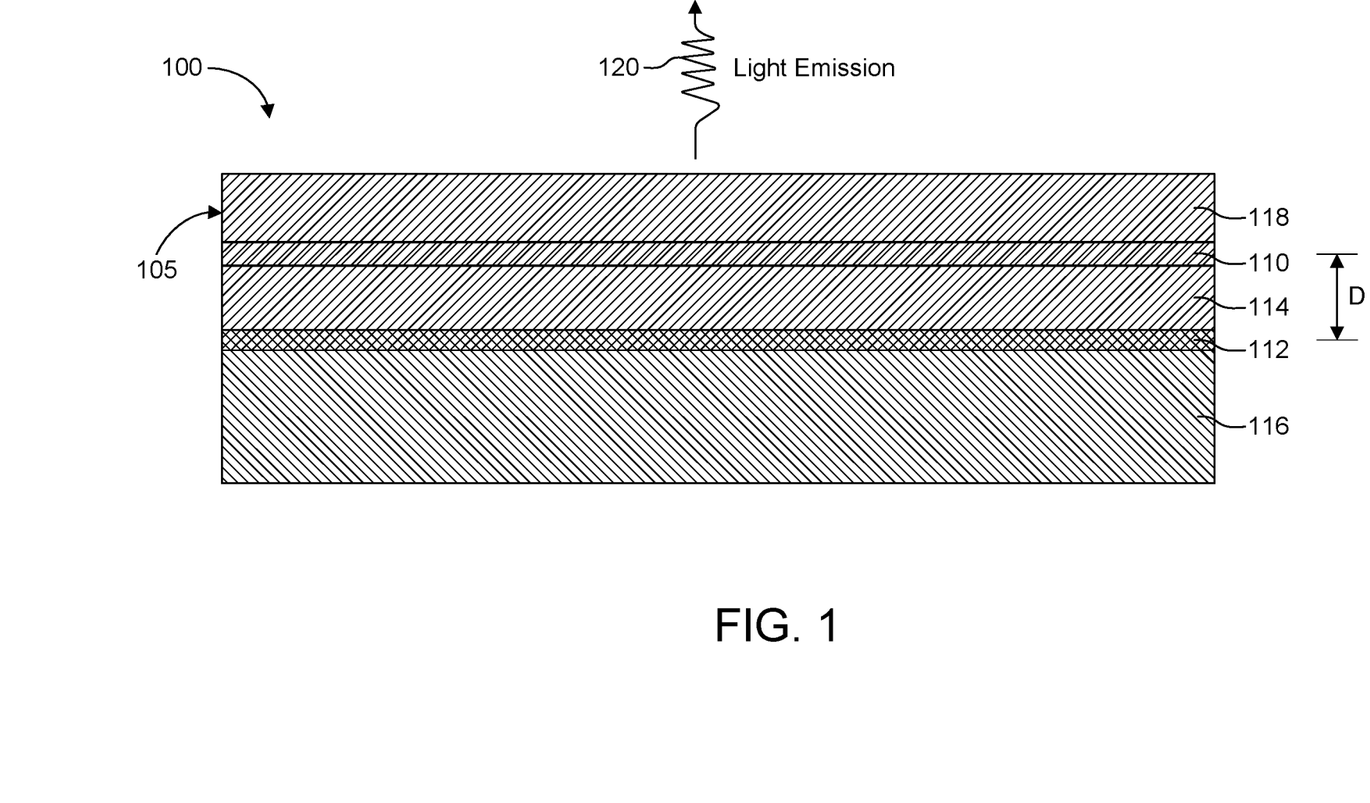
FIG. 1 is a schematic side view of a grating emitter with controllable polarization according to the present invention.

FIG. 1 shows one exemplary layer structure of the grating emitter with controllable polarization (GECP) 100 according to the principles of the present invention.

In general, emitter 100 is formed in a substrate 105 that includes two, upper and lower, guiding layers 110, 112, separated vertically by a transparent spacer cladding layer 114. The lower guiding layer 112 is usually supported on a structural substrate 116. An upper cladding layer 118 is located above the upper guiding layer 110.

The thickness of the spacer cladding layer 114 will usually have a uniform thickness, D. In particular, the uniformity of the layer should be within a small fraction of a wavelength of operation of the emitter. Preferably, the uniformity of D is tighter than λ+/−10%.

Light 120 is emitted vertically, in a surface-emitting configuration from the emitter 100 with coherence and polarization properties that are determined by the relative phase and spacing of the two guiding layers. In some cases, the light 120 is a beam propagating in free-space. On other examples, the light is coupled into and propagates in an output waveguide.

Figure 2:
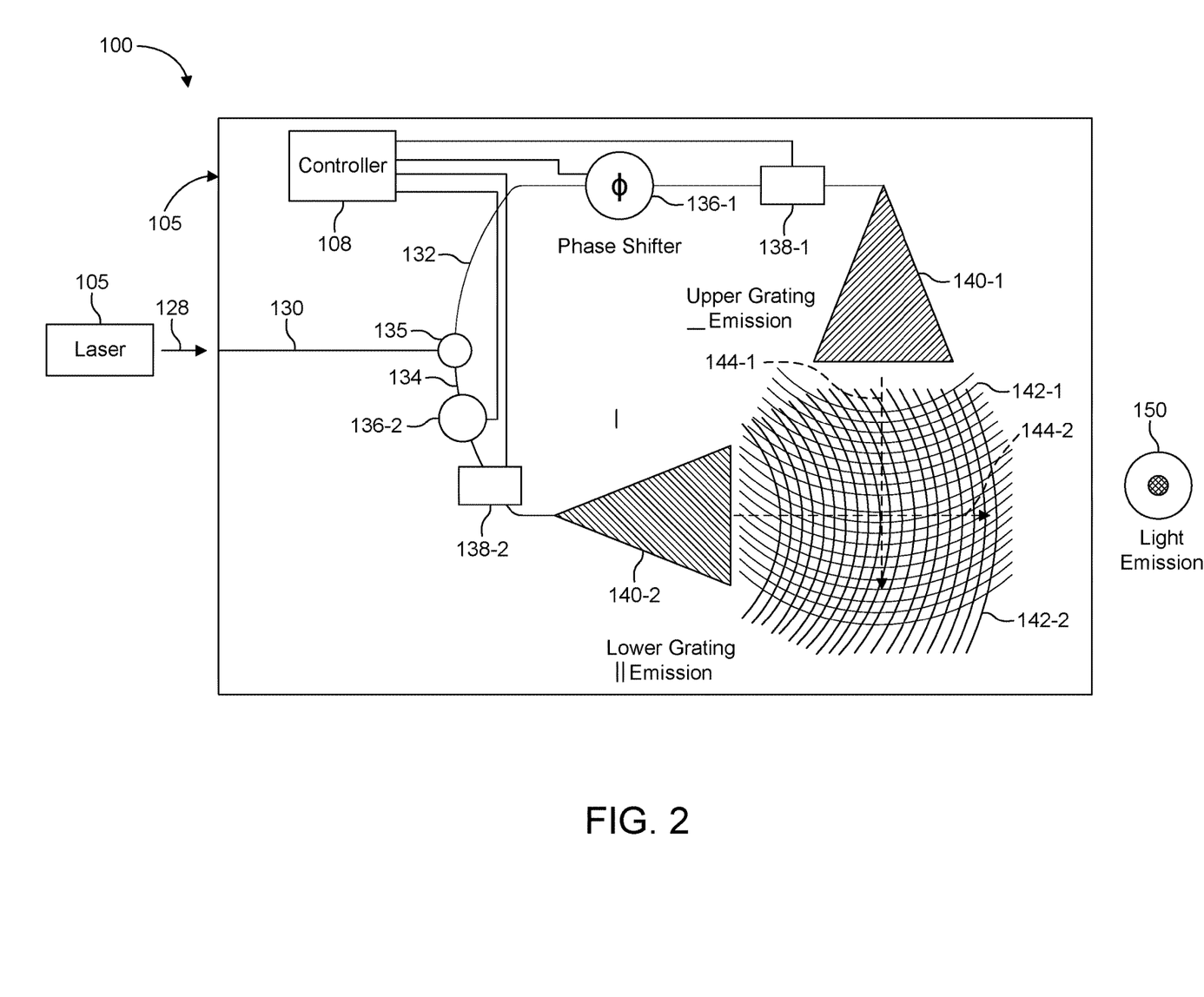
FIG. 2 is a schematic top view of a system including the grating emitter with controllable polarization.

FIG. 2 shows a top view of a system including the grating emitter 100.

In operation, light 128 enters the device 100 from the left into a receive waveguide 130. The light could be received from a laser 105 and coupled into the receive waveguide 130 by a lens. On other examples, the light could be coupled into the receive waveguide 130 via butt-coupling to another slab waveguide or an optical fiber. In the illustrated example, the receive waveguide 130 is fabricated in the lower guiding layer 112.

In general, the input light 128 is coherent light. Generally, the coherence length should beat least 1 mm.

The light in the receive waveguide 130 is split by a splitter 135 into two components: a first component propagating in a first waveguide 132 and a second component in a second waveguide 134. In the illustrated example, the first waveguide 132 is fabricated in the upper guiding layer 110 and the second waveguide 134 is fabricated in the lower guiding layer 112. Each of the receiving waveguide 130, first waveguide 132, and second waveguide 134 are preferably single transverse mode waveguides. There are a number of ways of implementing the splitter 135 to couple light from the receiving waveguide 130 into the first waveguide 132 and second waveguide 134 and between the different layers 110, 112 of the device 100. These include adiabatic couplers, directional couplers, multi-mode interference (MMI) couplers, and so on.

Either or both waveguides 132, 134 preferably contain an electrically-controllable phase delay 136-1, 136-2 and/or electrically-controllable variable attenuators 138-1, 138-2. In one embodiment, the electrically controllable phase delays 136-1, 136-2 are electro-optic phase modulators, e.g., lithium niobate phase modulators. And, the electrically-controllable variable attenuators 138-1, 138-2 are integrated photonic Mach-Zender interferometers.

On each layer 110, 112, the respective single mode waveguide 132, 134 is then adiabatically expanded (to maintain single mode) in respective mode expanders 140-1, 140-2. Each waveguide 132, 134 then terminates in respective shallow grating couplers 142-1, 142-2. These grating couplers 142-1, 142-2 are vertically aligned over each other. In addition, in the typical embodiment, an axis 144-1 of first grating coupler 142-1 and an axis 144-2 of the second grating coupler 142-2 are orthogonal to each other.

The grating couplers 142-1, 142-2 can be of the standard variety and formed in the upper guiding layer 110 and the lower guiding layer 112, respectively. Taillaert, et. al. "An Out-of-Plane Grating Coupler for Efficient Butt-Coupling Between Compact Planar Waveguides and Single-Mode Fibers," IEEE Journal of Quantum Electronics, Vol. 38, No. 7, July 2002 shows an appropriate grating.

In one application, a controller 108 is provided to control the phase changes applied by at least one phase shifter 136-1, 136-2 and the amplitude changes applied by the at least one variable attenuator 138-1, 138-2 to encode information in the time-changing phase of the generated output light 120. In other examples, the controller controls the phase shifters to switch the outgoing beam between right-circular polarization and left-circular polarization at a fixed frequency to effect push-pull optical pumping in an atomic clock.

Each of the gratings 142-1, 142-2 emits the linear polarization out of the plane of FIG. 2, see arrow 150, through the two emissions orthogonally-polarized with respect to each other. The two emitted beams combine interferometrically in the upper cladding layer 110 to produce free-space light emission of mixed polarization.

To understand the function of the device 100, consider the simplest case, in which the optical phase entering each of the grating emitters 142-1, 142-2 is identical and the thickness of the spacer cladding layer 114 is equal to one-quarter of the optical wavelength, i.e. D=λ/4. In this case the device 100 behaves like a conventional "quarter-wave plate," i.e. one of the two linear components is λ/4 delayed with respect to the other, resulting in the emission of circularly polarized light.

In the more general case, a variable phase retarder, see 136-1 for example, in one arm of the grating emitter 100 is adjusted by 0-2π of phase, resulting in phase difference between the two gratings 142-1, 142-2 that varies from 0-2π, resulting in arbitrary ellipticity of the interferometrically-combined output emission.

For those familiar with conventional approaches to polarization control, it is helpful to think of grating emitter as a waveplate, with electrically-variable "thickness," with its extraordinary axis oriented at 45° with respect to the (linear) polarization of a virtual collimated input beam.

When both 1) at least one variable phase retarder 136 and 2) the two variable attenuators are used 138-1, 138-2, the controller is capable of generating arbitrary polarization states, including linear polarization at any angle.

In another example, the two gratings 142-1, 142-2 are driven by two separate laser sources, rather than a single source split between the two. In this case, the two gratings 142-1, 142-2 are further driven at different optical frequencies. Thus, an output polarization state varies, at the difference frequency, between the two sources. This could produce polarization at arbitrarily higher frequency than could be achieved via direct phase modulation. If there are two frequencies for the two arms, then there would be no need for a phase shifter; the relative phase would automatically cycle through all 2π possible values at the difference frequency (laser #1 frequency—laser #2 frequency). This would be a situation where we do not have a specific predetermined phase that we need, but rather want it to cycle.

Figure 3:
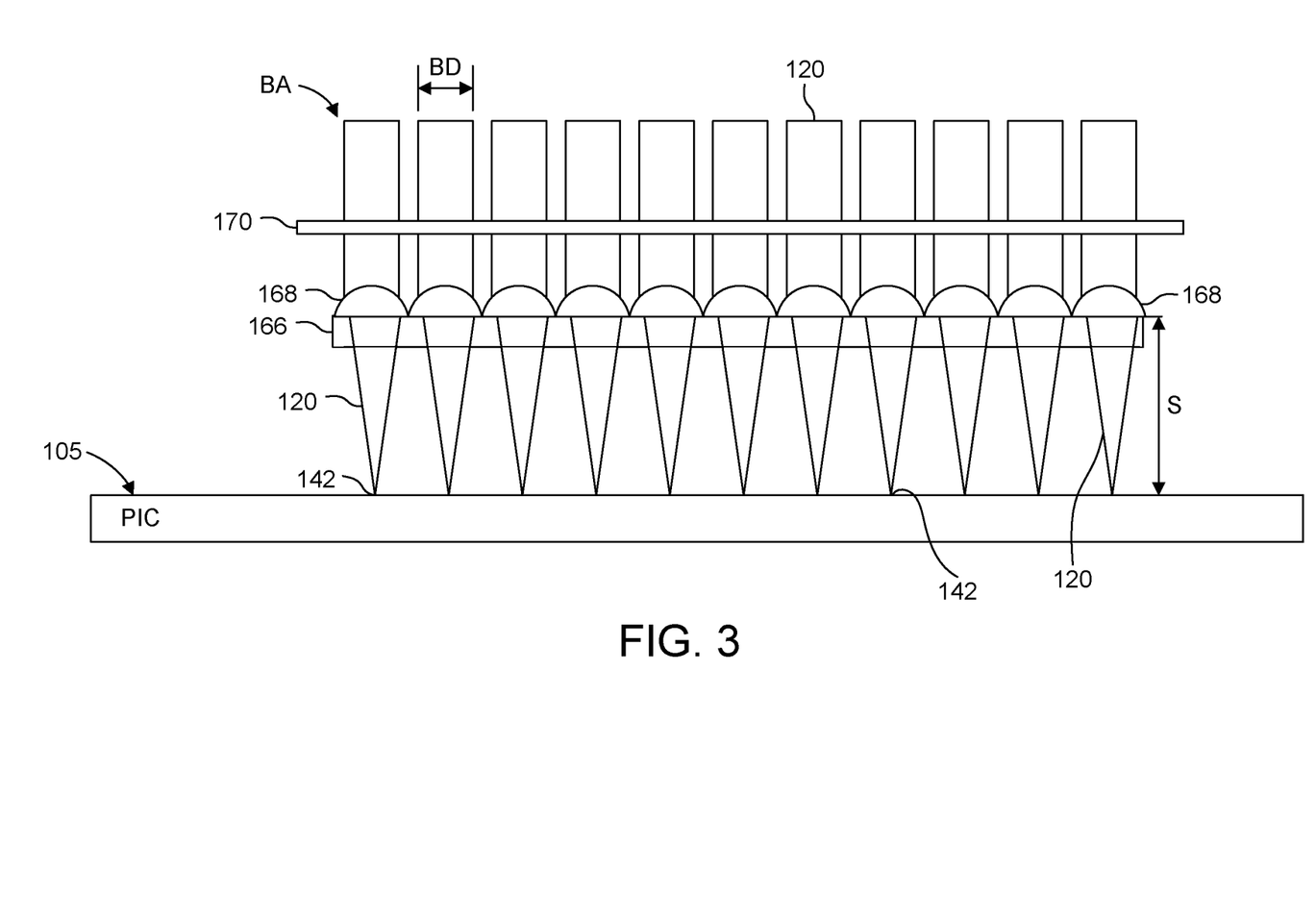
FIG. 3 is a schematic side-view of a photonic integrated circuit and other components configured to emit an array of small collimated beams, without controllable polarization.
Figure 4:
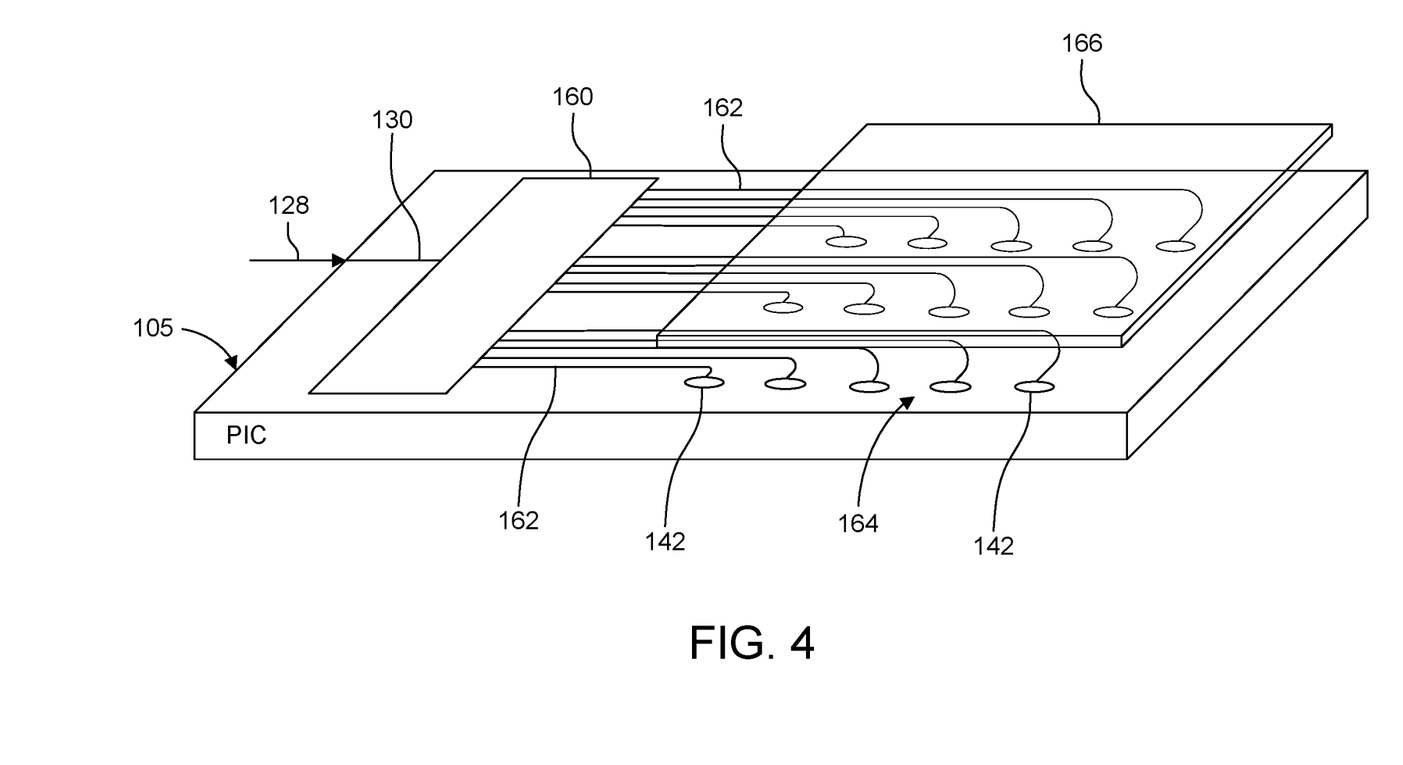
FIG. 4 is a schematic perspective view of the configuration of FIG. 3.

FIGS. 3 and 4 are schematic views of a photonic integrated circuit and other components configured to emit an array BA of small collimated beams 120, without controllable polarization.

Light 128 is received by the device from a laser, for example. This input light 128 is coupled into a receive waveguide 130 formed in a substrate 105 and is split into numerous waveguides 162 by a splitter 160. In one example, the splitter 160 is a 2×1 splitter tree. Another example is a bus waveguide that splits-off a bit of the light into each waveguide 162.

Each of the waveguides terminates in a grating emitter 142 in a two-dimensional array 164 of grating emitters 142.

The grating emitters 142 couple the light out of the substrate 105. Then each of those expanding free-space beams 120 is collimated by its own microlens 168 of a microlens array, which is formed in lens array substrate 166. Finally, optionally, a single quarter-wave plate 170 converts each beam 120 from linear to circular polarization, and also optionally, the array BA of collimated beams enters a vapor cell as part of an atomic clock.

This light-emission configuration has several beneficial properties for compact atomic clocks. First, compared to a typical chip-scale atomic clock in the art, see Lutwak, the amount of vertical space required for beam expansion is significantly smaller. For example, each small collimated beam might have a diameter BD of 100 µm, which would entail perhaps a spacing S of 300 µm between the top surface of the substrate 105 containing the grating emitters 142 and the microlens of the substrate 166, whereas a single expanding beam might require >1 mm of space to expand to fill a similarly-sized vapor cell.

Moreover, compared to the same typical chip-scale atomic clock, which does not have a light collimator, the intensity uniformity of the configuration herein can be better, as a collimated beam has less intensity inhomogeneity than an expanding beam. Intensity inhomogeneity is detrimental to atomic clock performance, due to line broadening.

Second, compared to a large-area emitter or phased array emitter, the tolerance to fabrication errors and operating temperature changes is likely to be better. Specifically, the various small collimated beams do not substantially overlap at any point, except perhaps in the weaker outskirts of the beams, and therefore the optical phase relation between beams is irrelevant to performance. Maintaining a controlled phase relation over a large area of photonic integrated (PIC) substrate 105 is challenging in practice, and therefore avoiding that requirement is beneficial. Relatedly, small grating emitters 142 (for example, 5 µm) are easier to design and fabricate than very large grating emitters (for example, 1 mm).

The microlenses 168 of the array in the substrate 166 may be diffractive, refractive, or holographic, and the various free-space components (PIC, microlens array, quarter-wave plate, vapor cell top) may be fused, combined, or reconfigured in various ways. Also, the grating emitters 142 may emit downward into the PIC substrate 105, with microlenses imprinted or patterned onto the opposite side of the PIC, for example. The quarter-wave plate could be omitted in an atomic-clock application if the grating directly emits circularly-polarized light.

Other methods of splitting the light among the grating emitters are also known in the art—for example, the light could travel along a bus waveguide, with small amounts getting pulled out by an evanescent coupler into each grating emitter.

Figure 5:
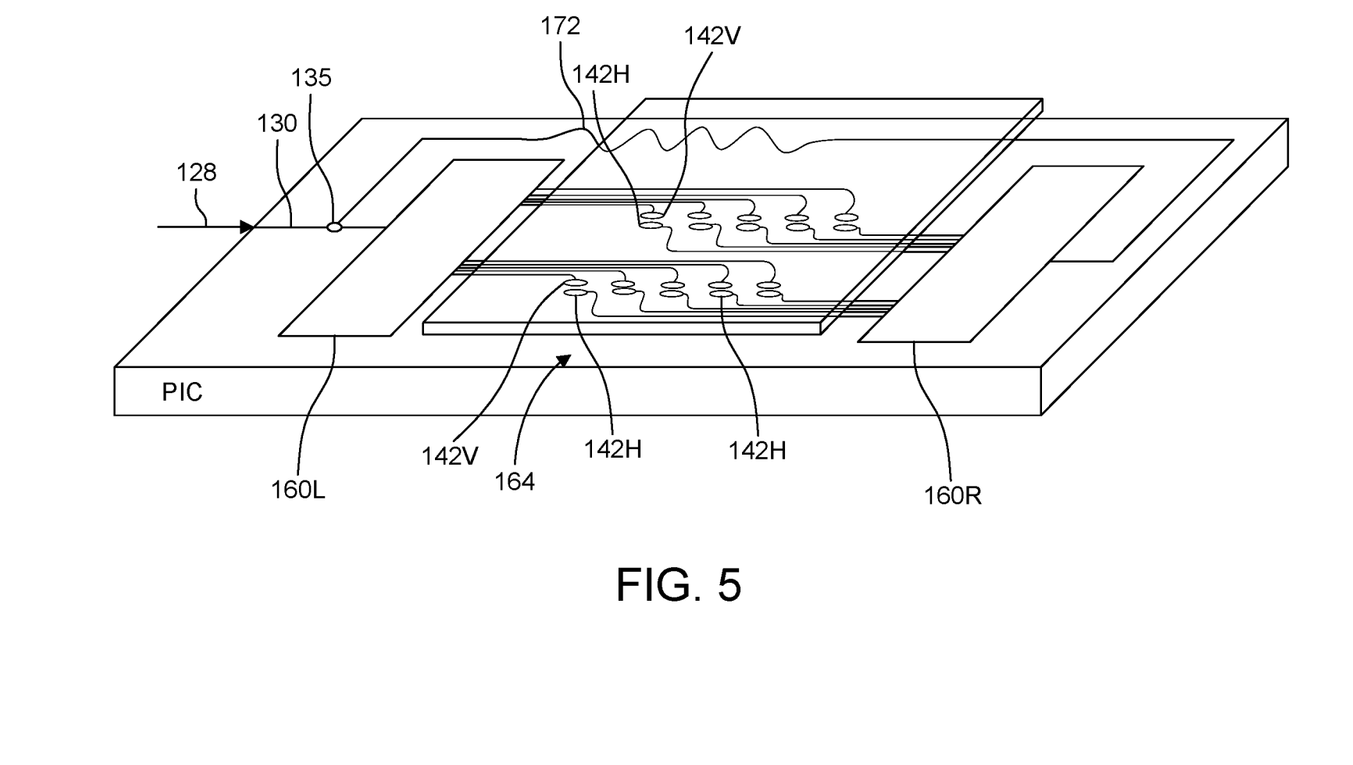
FIG. 5 is a schematic perspective view of a photonic integrated circuit and other components configured to emit an array of small collimated beams, each of which cycles between different polarization states when the input light is modulated.
Figure 6:
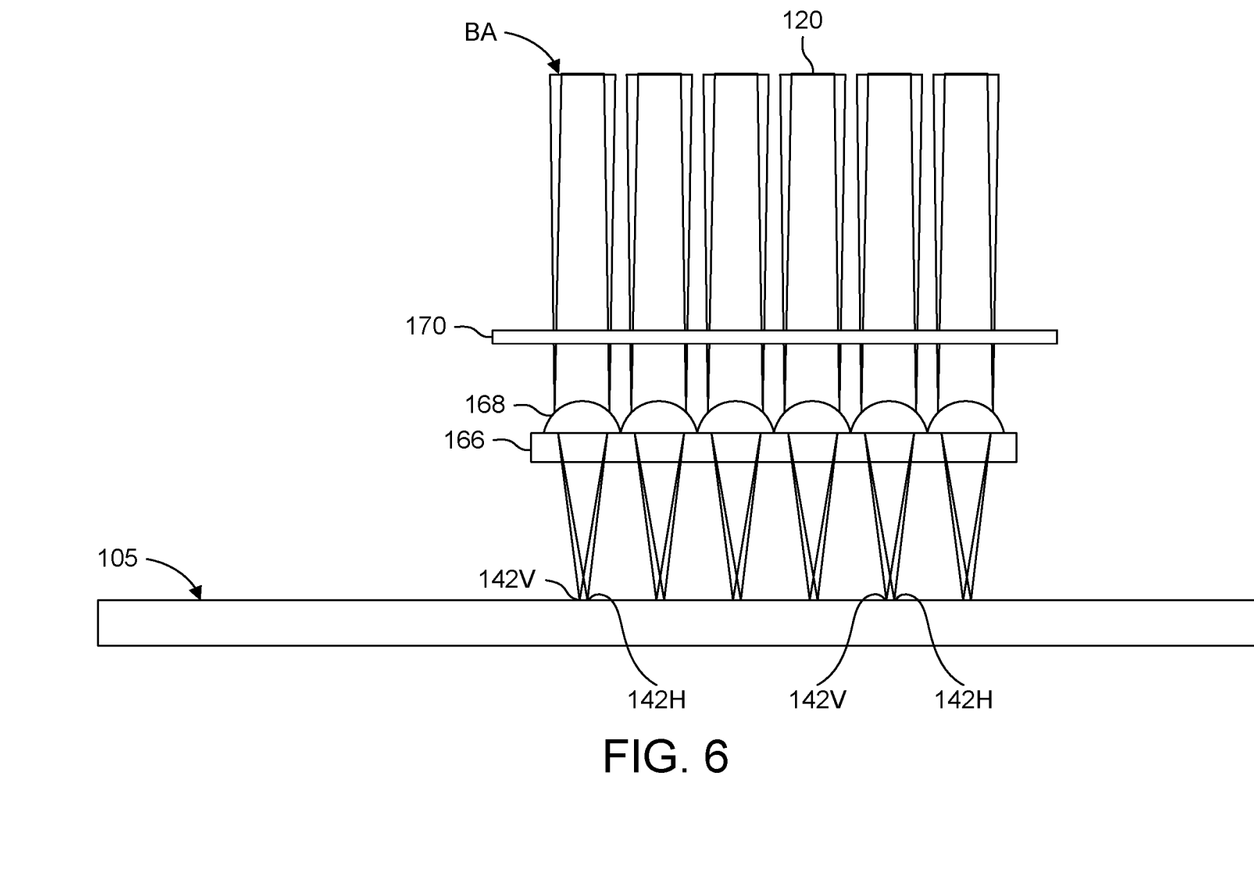
FIG. 6 is a schematic side view of the configuration of FIG. 5.

FIGS. 5 and 6 are schematic views of a photonic integrated circuit and other components configured to emit an array BA of small collimated beams 120 according to another embodiment.

This example has the capability to rapidly switch polarization of each beam 120, as a consequence of the input beam 128 being frequency- or amplitude-modulated.

The modulated input light on receive waveguide 130 is split 50/50 in a splitter 135, with half the light going into the left waveguide splitter 160L (as above, a tree of 1×2 splitters, for example), then into an array of vertically polarized grating emitters 142V.

The remaining light split-off by splitter 135 is similarly sent to a right waveguide splitter 160R (as above, a tree of 1×2 splitters, for example), then into an array of horizontally-polarized grating emitters 142H.

Possibly an explicit optical delay line 172 is added to the waveguide path to the right waveguide splitter 160R. If the input light is modulated at a frequency f, or period T=1/f, the device may be designed such that the light going into free space via the right splitter takes roughly T/2 longer than the light going into free space via the left splitter. For example, in a cesium atomic clock, the input beam might be modulated at 4.6 GHz, and if the waveguide refractive index is 1.5, then the path to free space via the right splitter might be approximately (½)/(4.6 GHz)/1.5≈2 centimeters (cm) longer than the path to free space via the left splitter. This way, the two grating emitters in each pair see opposite phases of the source modulation pattern.

As before, the beams, once emitted into free space, are collimated by a microlens 168 of an array in a lens array substrate, and for atomic clocks, they are converted to circular polarization by a quarter-wave plate 170, oriented such that the two types of emitted polarization are converted into the two opposite circular polarizations.

Pairs of grating emitters 142V, 142H share the same microlens 168, with each pair comprising a vertically-polarized beam from the left splitter 160L and a horizontally-polarized beam from the right splitter 160R. As shown in the figure, while the collimated beams from these two grating emitters may not perfectly overlap, they at least substantially overlap. For example, if the grating emitters are 5 µm apart, and the microlens is 400 µm from the grating emitters, then the resulting beams will be just 0.7° tilted apart, and after 1 mm they will have walked off by 13 µm, which is small compared to the perhaps 100 µm beam diameter.

Because the two beams overlap, and have opposite phase with respect to the microwave modulation, and have opposite circular polarization, the resulting light will be suitable for push-pull optical pumping, which as mentioned above has a beneficial impact on the signal-to-noise ratio of an atomic clock.

While the illustrative description above mentioned that the pairs of grating emitters would have one with horizontal polarization and one with vertical polarization emitter, in fact any two orthogonal polarizations could be used. If the gratings directly emitted opposite circular polarizations, then the waveplate could be omitted in an atomic clock application.

Figure 7:
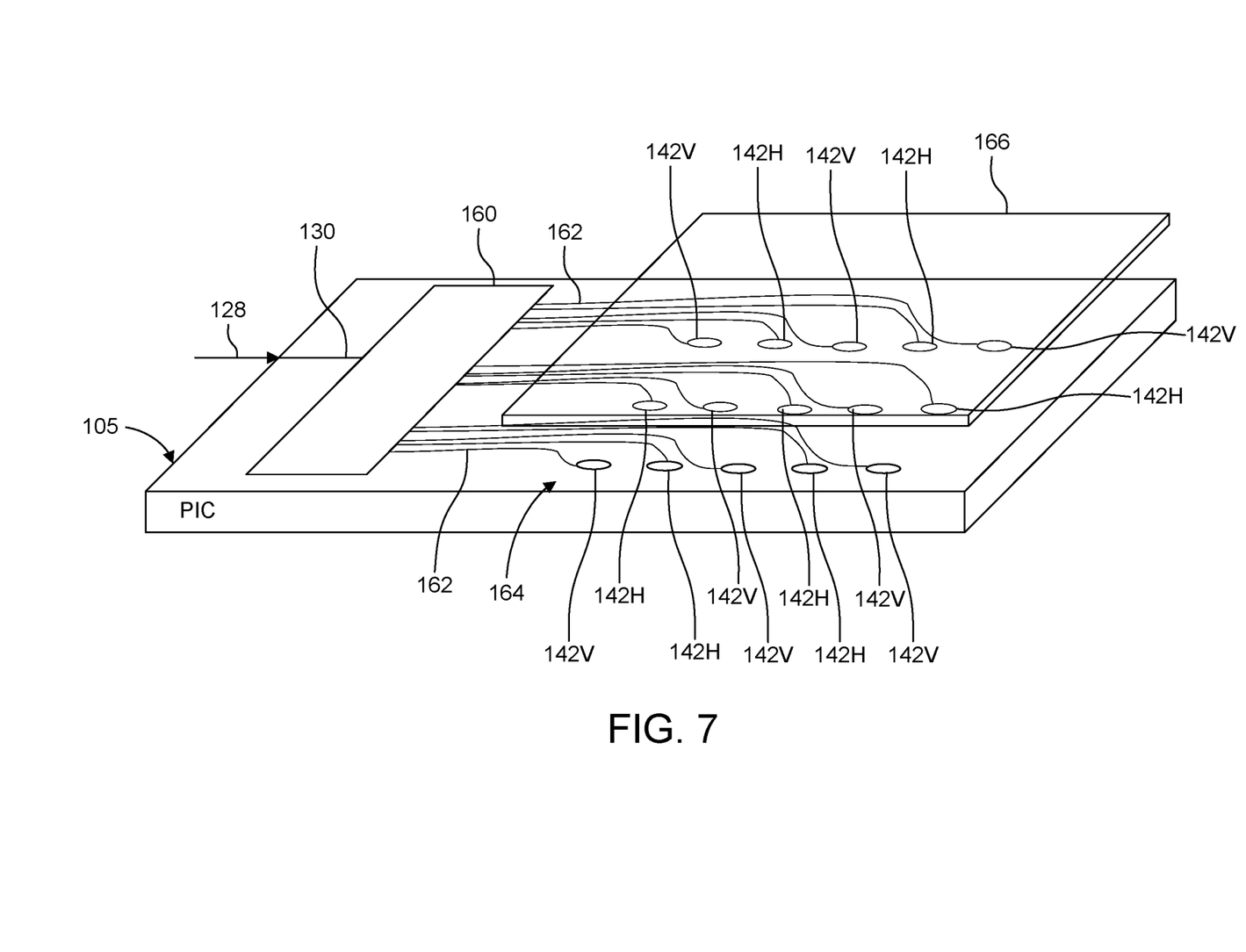
FIG. 7 is a schematic perspective view of a device that emits an array of small collimated beams, with different beams having different polarizations, for example, in a checkerboard pattern.

FIG. 7 is a schematic perspective view of a photonic integrated circuit and other components configured to emit an array of small collimated beams with spatially-varying polarizations, but with each polarization fixed in time.

As before, a splitter 160 feeds an array of grating emitters that are distributed in a checkboard pattern between horizontally-polarized grating emitters 142H and vertically-polarized grating emitters 142V.

In more detail, here the different beams have different polarizations, for example alternating between left-circular and right-circular polarization in a checkerboard pattern. This configuration, as part of an atomic clock, is a compromise between the simplicity and compactness of the embodiment of FIGS. 3-4 and the performance of the embodiment of FIGS. 5-6.

As context, the primary reason that push-pull optical pumping is beneficial for atomic clocks is that atoms can get stuck in a "dark state", wherein they stop contributing to the atomic clock signal. However, the dark state for left-circular-polarized light is different than the dark state for right-circular polarized light. Push-pull is effective because both polarizations are present at once, preventing atoms from getting stuck.

This configuration can capture some of that benefit in a different way. In a vapor cell, atoms move around by diffusion. If an atom is in a left-circular-polarized beam, it may get stuck in the corresponding dark state. However, it may then diffuse into the neighboring beam, which would be right-circular-polarized. It would then get pumped out of that state, contributing to the signal again. The extent to which this checkerboard alternation of polarizations captures the benefit of push-pull optical pumping is a variable function of the vapor cell pressure and temperature, beam size, and other considerations.

While this invention has been particularly shown and described with references to preferred embodiments thereof, it will be understood by those skilled in the art that various changes in form and details may be made therein without departing from the scope of the invention encompassed by the appended claims.

What is claimed is:

1. A system for modulating polarization of an optical beam, the system comprising:
    a light source for generating light into a first waveguide and a second waveguide;
    a first grating coupler for coupling the light from the first waveguide into an output emission;
    a second grating coupler for coupling the light from the second waveguide into the output emission; and
    at least one phase shifter for shifting the phase of the light between the first waveguide and the second waveguide in order to control a polarization of the output emission.

2. The system of claim 1, further comprising at least one variable attenuator for controlling the relative amplitude of the light in the first waveguide and the second waveguide.

3. The system of claim 1, wherein the light from the light source is coherent.

4. The system of claim 1, wherein the first grating coupler and the second grating coupler are vertically aligned over each other.

5. The system of claim 1, wherein an axis of first grating coupler and an axis of the second grating coupler are orthogonal to each other.

6. The system of claim 1, further comprising a first mode expander for coupling the first waveguide to the first grating coupler; and a second mode expander for coupling the second waveguide to the second grating coupler.

7. The system of claim 1, wherein the first waveguide is fabricated in a first guiding layer and the second waveguide is fabricated in a second guiding layer.

8. The system of claim 7, further comprising a spacer cladding layer separating the first guiding layer and the second guiding layer.

9. A system for generating an array of optical beams for use in an atomic clock, the system comprising:
    a substrate;
    at least one optical splitter in the substrate for splitting a received optical signal into separate optical signals;
    an array of grating emitters, the grating emitters for coupling the separate optical signals out of the substrate into beam array to an atomic clock for push-pull optical pumping; and
    at least one phase shifter for shifting the phase of the light between the first waveguide and the second waveguide in order to control a polarization of the output emission.

10. The system of claim 9, further comprising a lens array for collimating beams of the beam array.

11. The system of claim 9, further comprising a quarter wave plate for changing a polarization of beams of the beam array.

12. The system of claim 9, wherein the grating emitters comprise grating emitters that emit beams with at least two different polarization states.

13. The system of claim 12, further comprising a periodically-modulated light source, and a time-delay difference between two subsets of the emitters approximating half the modulation period.

14. The system of claim 12, wherein grating emitters comprising opposite polarization states are arranged in pairs.

15. The system of claim 12, wherein the grating emitters of two opposite polarization states are arranged in a checkerboard pattern.

16. A system for modulating polarization of an optical beam, the system comprising:
    a light source for generating coherent light, with a coherence length of at least 1 millimeter, into a first waveguide and a second waveguide;
    a first grating coupler for coupling the light from the first waveguide into an output emission;
    a second grating coupler for coupling the light from the second waveguide into the output emission; and
    at least one phase shifter for shifting the phase of the light between the first waveguide and the second waveguide in order to control a polarization of the output emission.

17. The system of claim 16, further comprising at least one variable attenuator for controlling the relative amplitude of the light in the first waveguide and the second waveguide.

18. The system of claim 16, wherein the first grating coupler and the second grating coupler are vertically aligned over each other.

19. The system of claim 18, wherein an axis of first grating coupler and an axis of the second grating coupler are orthogonal to each other.

20. The system of claim 19, further comprising a first mode expander for coupling the first waveguide to the first grating coupler; and a second mode expander for coupling the second waveguide to the second grating coupler.

* * * * *